(12) United States Patent
Do et al.

(10) Patent No.: US 8,673,747 B2
(45) Date of Patent: Mar. 18, 2014

(54) METHOD OF FABRICATING SEMICONDUCTOR DEVICE

(75) Inventors: Jin-Ho Do, Yongin-si (KR); Ha-Jin Lim, Seoul (KR); Weon-Hong Kim, Suwon-si (KR); Hoi-Sung Chung, Hwaseong-si (KR); Moon-Kyun Song, Anyang-si (KR); Dae-Kwon Joo, Osan-si (KR)

(73) Assignee: Samsung Electronics Co., Ltd. (KR)

( * ) Notice: Subject to any disclaimer, the term of this patent is extended or adjusted under 35 U.S.C. 154(b) by 301 days.

(21) Appl. No.: 13/093,097

(22) Filed: Apr. 25, 2011

(65) Prior Publication Data

US 2011/0306184 A1   Dec. 15, 2011

(30) Foreign Application Priority Data

Jun. 9, 2010   (KR) .................. 10-2010-0054420

(51) Int. Cl.
*H01L 21/00* (2006.01)

(52) U.S. Cl.
USPC ....... 438/478; 438/507; 438/509; 257/E21.09

(58) Field of Classification Search
USPC .......................... 438/478, 507, 509
See application file for complete search history.

(56) References Cited

U.S. PATENT DOCUMENTS

| 2005/0205010 A1* | 9/2005 | Ferro et al. ............. 118/715 |
| 2007/0161196 A1* | 7/2007 | Currie et al. ............. 438/287 |
| 2008/0237812 A1* | 10/2008 | Terahara et al. ........... 257/647 |

FOREIGN PATENT DOCUMENTS

| KR | 2003-0000575 | 1/2003 |
| KR | 2003-0002260 | 1/2003 |
| KR | 10-2009-0017399 | 2/2009 |
| KR | 10-0705175 | 4/2011 |

* cited by examiner

*Primary Examiner* — Alexander Ghyka
(74) *Attorney, Agent, or Firm* — Onello & Mello, LLP

(57) ABSTRACT

A method of fabricating a semiconductor device includes: forming an epitaxial layer on a semiconductor substrate; forming a capping layer having a first thickness on the epitaxial layer; and oxidizing the capping layer in an oxygen atmosphere to form a first gate dielectric layer having a second thickness.

4 Claims, 11 Drawing Sheets

METHOD OF FABRICATING SEMICONDUCTOR DEVICE

CROSS-REFERENCE TO RELATED APPLICATIONS

This application claims priority under 35 U.S.C. 119 to Korean Patent Application No. 10-2010-0054420, filed in the Korean Intellectual Property Office on Jun. 9, 2010, the entire contents of which are incorporated herein by reference.

BACKGROUND

1. Field of the Invention

The present inventive concept relates to a method of fabricating a semiconductor device.

2. Description of the Prior Art

Because there exists a wide variety of semiconductor devices, there also exists a wide variety of desirable or required semiconductor device characteristics. For example, devices which merge logic and CPU (Central Processing Unit) with DRAM (Dynamic Random Access Memory) or SRAM (Static Random Access Memory) have been in demand. For such devices, formation of a reliable gate oxide layer in a single chip is important to maintain device characteristics.

SUMMARY

The present inventive concept provides a method of fabricating a semiconductor device that forms a reliable gate dielectric layer.

According to one aspect, the inventive concept is directed to a method of fabricating a semiconductor device, the method comprising: providing a semiconductor substrate; forming an epitaxial layer on the semiconductor substrate; forming a capping layer on the epitaxial layer, the capping layer having a first thickness; and oxidizing the capping layer in an atmosphere containing oxygen to form a first gate dielectric layer, the first gate dielectric layer having a second thickness.

In some embodiments, the epitaxial layer includes silicon (Si) and germanium (Ge). In some embodiments, the first thickness is about half of the second thickness. In some embodiments, forming the first gate dielectric layer is performed at a temperature between about 600° C. and about 800° C. In some embodiments, the capping layer is an epitaxial layer including silicon.

In some embodiments, the method further comprises forming a second gate dielectric layer on the first gate dielectric layer. The method of claim 6, wherein forming the second gate dielectric layer comprises performing a thermal chemical vapor deposition (CVD) oxide layer formation method. In some embodiments, forming the second gate dielectric layer is performed at a temperature between about 600° C. and about 800° C.

According to another aspect, the inventive concept is directed to a method of fabricating a semiconductor device, the method comprising: providing a semiconductor substrate; forming an epitaxial layer on the semiconductor substrate; forming a capping layer on the epitaxial layer, the capping layer having a first thickness; and forming a first gate dielectric layer on the capping layer by performing a thermal chemical vapor deposition (CVD) oxide layer formation method.

In some embodiments, the epitaxial layer includes silicon (Si) and germanium (Ge). In some embodiments, forming the first gate dielectric layer is performed at a temperature between about 600° C. and about 800° C.

In some embodiments, the method further comprises oxidizing the capping layer in an atmosphere containing oxygen to form a second gate dielectric layer, the second gate dielectric layer having a second thickness.

In some embodiments, the first thickness is about half of the second thickness.

In some embodiments, forming the second gate dielectric layer is performed at a temperature between about 600° C. and about 800° C.

In some embodiments, the capping layer is an epitaxial layer including silicon.

According to another aspect, the inventive concept is directed to a method of fabricating a semiconductor device, the method comprising: providing a semiconductor substrate; forming an epitaxial layer on the semiconductor substrate; forming a capping layer on the epitaxial layer, the capping layer having a first thickness; oxidizing the capping layer in an atmosphere containing oxygen to form a first gate dielectric layer, the first gate dielectric layer having a second thickness; and forming a second gate dielectric layer on the first gate dielectric layer, wherein forming the second gate dielectric layer comprises performing a thermal chemical vapor deposition (CVD) oxide layer formation method.

In some embodiments, forming the first gate dielectric layer is performed at a first temperature between about 600° C. and about 800° C., and forming the second gate dielectric layer is performed at a second temperature between about 600° C. and about 800° C.

In some embodiments, the epitaxial layer includes silicon (Si) and germanium (Ge).

In some embodiments, the first thickness is about half of the second thickness.

In some embodiments, the capping layer is an epitaxial layer including silicon.

According to another aspect, the inventive concept is directed to a method of fabricating a semiconductor device. The method include: growing an epitaxial layer on a semiconductor substrate; and oxidizing a part of the epitaxial layer to form a first gate dielectric layer, wherein the first gate dielectric layer is formed at a temperature between about 600° C. and about 800° C.

BRIEF DESCRIPTION OF THE DRAWINGS

The foregoing and other features and advantages of the inventive concept will be apparent from the more particular description of preferred embodiments of the inventive concept, as illustrated in the accompanying drawings in which like reference characters refer to the same parts throughout the different views. The drawings are not necessarily to scale, emphasis instead being placed upon illustrating the principles of the inventive concept. In the drawings, the thickness of layers and regions may be exaggerated for clarity.

DETAILED DESCRIPTION OF THE EMBODIMENTS

Figure 1:
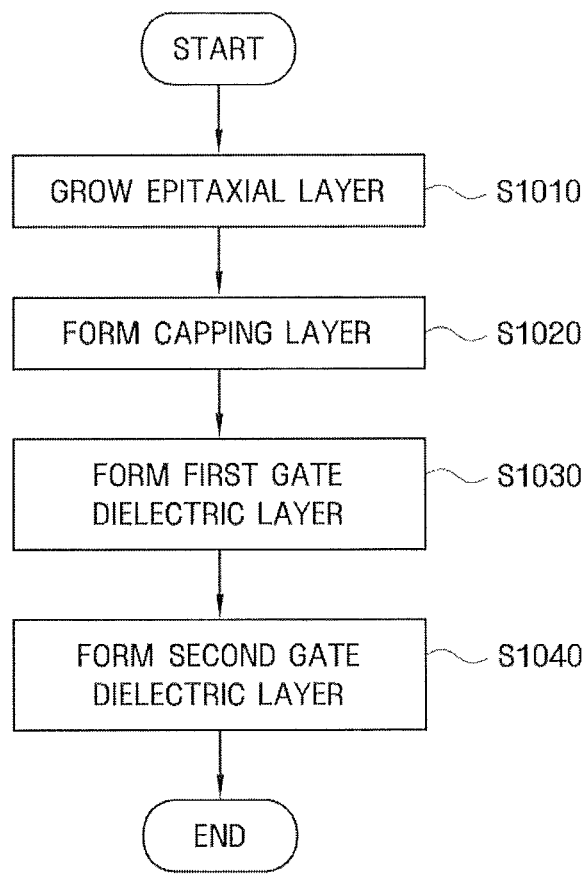
FIG. 1 is a flow chart illustrating steps in a method of fabricating a semiconductor device according to a first exemplary embodiment of the present inventive concept.

Advantages and features of the present inventive concept and methods of accomplishing the same may be understood more readily by reference to the following detailed description of exemplary embodiments and the accompanying drawings. The present inventive concept may, however, be embodied in many different forms and should not be construed as being limited to the embodiments set forth herein. Rather, these embodiments are provided so that this description will be thorough and complete and will fully convey the inventive concept to those skilled in the art, and the present inventive concept will only be defined by the appended claims.

Like reference numerals refer to like elements throughout the specification. As used herein, the term "and/or" includes any and all combinations of one or more of the associated listed items.

As used herein, the singular forms "a", "an" and "the" are intended to include the plural forms as well, unless the context clearly indicates otherwise. It will be further understood that the terms "comprises" and/or "made of," when used in this specification, specify the presence of stated components, steps, operations, and/or elements, but do not preclude the presence or addition of one or more other components, steps, operations, elements, and/or groups thereof.

It will be understood that, although the terms first, second, third, etc., may be used herein to describe various elements, these elements should not be limited by these terms. These terms are only used to distinguish one element from another element. Thus, a first element discussed below could be termed a second element without departing from the teachings of the present inventive concept.

Embodiments of the inventive concept are described herein with reference to plan and cross-sectional illustrations that are schematic illustrations of idealized embodiments of the inventive concept. As such, variations from the shapes of the illustrations as a result, for example, of manufacturing techniques and/or tolerances, are to be expected. Thus, embodiments of the inventive concept should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, referring to FIGS. 1 through 16, a method of fabricating a semiconductor device according to the exemplary embodiments of the present inventive concept is described.

Referring to FIGS. 1 through 5, a method of fabricating a semiconductor device according to a first exemplary embodiment of the present inventive concept is described. FIG. 1 is a flow chart illustrating a method of fabricating a semiconductor device according to the first exemplary embodiment of the present inventive concept, and FIGS. 2 through 5 are schematic sectional views sequentially illustrating the method of fabricating a semiconductor device according to the first exemplary embodiment of the present inventive concept.

Figure 2:
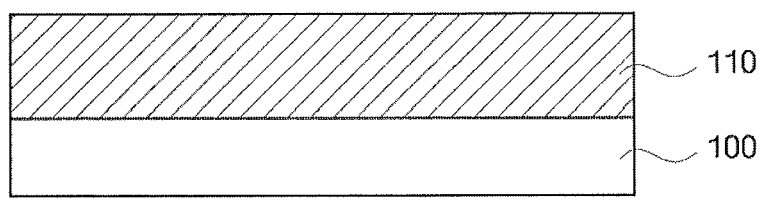
FIGS. 2 through 5 are schematic sectional views sequentially illustrating a fabricating method of a semiconductor device according to the first exemplary embodiment of the present inventive concept.

Referring to FIGS. 1 and 2, in the method of fabricating a semiconductor device according to the first exemplary embodiment of the present inventive concept, an epitaxial layer 110 is formed or grown on a semiconductor substrate 100 (Step S1010). The semiconductor substrate 100 can include bulk-type silicon. For forming or growing the epitaxial layer 110 on the semiconductor substrate 100, one of solid phase epitaxy (SPE), liquid phase epitaxy (LPE), and vapor phase epitaxy (VPE) can be used. For example, in the method of fabricating a semiconductor device according to the first exemplary embodiment, by using a source gas including silicon (Si) and germanium (Ge), the single-crystal epitaxial layer 110 is formed at a temperature between about 500° C. and about 800° C. As a result, the single-crystal epitaxial layer 110 including silicon germanium (Si—Ge) is formed on the semiconductor substrate 100. Next, to stabilize the Si—Ge single-crystal epitaxial layer 110, a predetermined heat treatment process can additionally be performed.

Figure 3:
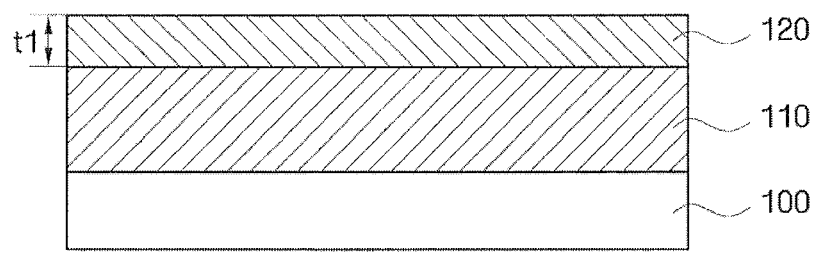

Next, referring to FIGS. 1 and 3, a capping layer 120 can be formed on the epitaxial layer 110 (Step S1020). The capping layer 120 is formed as a first gate dielectric layer (refer to 131 of FIG. 4) by an ISSG (In-Situ Steam Generation) process in the subsequent process, as described below in greater detail.

In some exemplary embodiments, the capping layer 120 can be formed on the epitaxial layer 110 with a source gas, which can include silicon (Si), to grow an epitaxial layer including silicon (Si). For example, the capping layer 120 can be formed using $SiH_2Cl_2$, Dichlorosilane (DCS) source gas and a process gas including HCl. In some embodiments, the capping layer 120, as described above, can be formed on the epitaxial layer 110 after forming the epitaxial layer 110. However, alternatively, the epitaxial layer 110 and the capping layer 120 can be formed simultaneously. Thus, in some exemplary embodiments, by controlling concentration of germanium (Ge), which is a source gas used during the epitaxial layer 110 formation, the epitaxial layer 110 and the capping layer 120 can be formed simultaneously. In this case, the epitaxial layer 110 including Si—Ge and the capping layer 120, which is an epitaxial layer including Si, can be grown simultaneously on the semiconductor substrate.

The capping layer 120 can be formed to have a thickness referred to herein as a first thickness t1. The first thickness t1 of the capping layer 120 is related to a second thickness t2 of a first gate dielectric layer (refer to 131 of FIG. 4) to be formed in a subsequent process step. In some exemplary embodiments, the first thickness t1 of the capping layer 120 can be formed to be, for example, half of the second thickness t2 of the first gate dielectric layer (refer to 131 of FIG. 4) to be formed in the subsequent process step, as described in further detail below.

Figure 4:
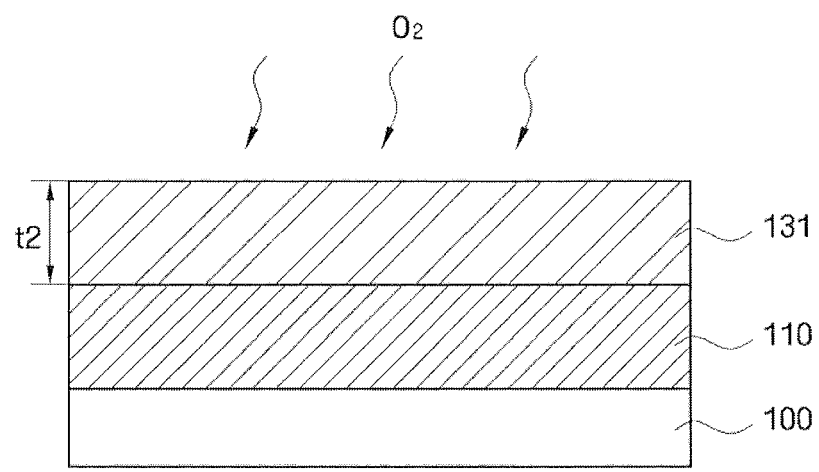

Next, referring to FIGS. 1 and 4, the capping layer 120 is oxidized in, for example, an oxygen atmosphere, and the first gate dielectric layer 131 is formed (Step S1030). The capping layer 120 can be oxidized using ISSG (In-Situ Steam Generation) equipment. In some specific exemplary embodiments, oxidizing the capping layer 120 to form the first gate dielectric layer 131 can be performed under an oxygen atmosphere at a temperature between, for example, about 600° C. and about 800° C. If the capping layer 120 is processed to form the first gate dielectric layer 131 at a temperature below 600° C., oxidization of the capping layer 120 may not occur, or the oxidation can be delayed, which can cause process loss. For example, the first gate dielectric layer 131 having relatively poor TDDB (Time Dependent Dielectric Breakdown) characteristics can be formed, and reliability of the semiconductor device can be degraded.

In contrast, if the capping layer 120 is processed to form the first gate dielectric layer 131 at a temperature above about 800° C., oxidization of the capping layer 120 proceed correctly, but the characteristics of the epitaxial layer 110 under the capping layer 120 may be affected. For example, in a case in which the epitaxial layer 110 includes silicon-germanium (Si—Ge), coagulation characteristics of Ge can be changed. Thus, Ge crystallization with Si does not occur, and a Ge agglomeration phenomenon in which only Ge atoms agglomerate together occurs. As a result, the mobility characteristics and charge leakage characteristics of the epitaxial layer 110 including Si—Ge can be degraded. Therefore, when the first gate dielectric layer 131 formed on the epitaxial layer 110 including Si—Ge is formed at a temperature above about 800° C., electrical characteristics of the epitaxial layer 110 including Si—Ge under the first gate dielectric layer 131 can be degraded. Also, using the epitaxial layer 110 as the channel region of a thin film transistor can create a reliability problem of a semiconductor device.

In some particular exemplary embodiments, the first gate dielectric layer 131 can be formed to have about twice the thickness of the capping layer 120. To aid in an understanding of the inventive concept, the thickness of the first gate dielectric layer 131 is defined as t2. As described above, the capping layer 120, for example, includes Si, and the first gate dielectric layer 131 includes silicon oxide ($SiO_2$). Thus, since the capping layer 120 practically only includes Si mono atoms and the first gate dielectric layer 131 includes a Si atom two oxygen (O) atoms, a volume of the first gate dielectric layer 131 can be increased relatively compared to the capping layer 120. Therefore, the first gate dielectric layer 131 can be formed to have a thickness t2 of about twice the thickness t1 of the capping layer 120. Also, due to the reasons described above, the first thickness t1 can be determined by considering the final target of the second thickness t2 of the first gate dielectric layer 131. For example, if the second thickness t2 of the first gate dielectric layer 131 is formed to have a thickness between about 10 Å and about 50 Å, the first thickness t1 of the capping layer 120 can be formed to have a thickness between about 5 Å and about 25 Å.

In some exemplary embodiments, the capping layer 120 can be oxidized under pressure between about 0.1 torr and about 10 torr. Also, if oxygen gas used for the capping layer 120 oxidization is diluted with nitrogen gas or an inert gas, drastic oxidation of the capping layer 120 can be prevented.

Figure 5:
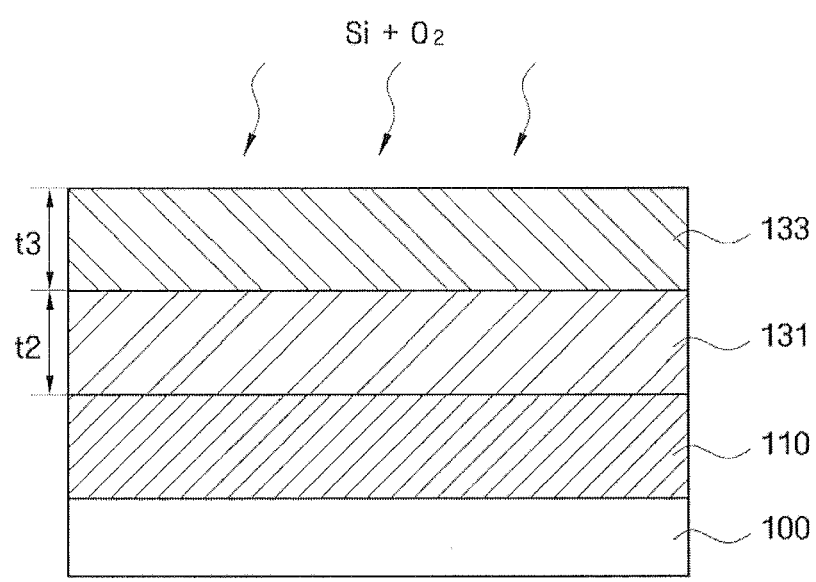

Next, referring to FIGS. 1 and 5, a second gate dielectric layer 133 can be formed on the first gate dielectric layer 131 (Step S1040).

The second gate dielectric layer 133 can be formed on the first gate dielectric layer 131 to have a predetermined thickness of t3. In some particular exemplary embodiments, the sum of the thickness t3 of the second gate dielectric layer 133 and the thickness t2 of the first gate dielectric layer 131 can be about 50 Å to about 150 Å. For example, when the thickness t2 of the first gate dielectric layer 131 is formed to be about 20, the thickness t3 of the second gate dielectric layer 133 can be formed to be between about 30 Å and about 130 Å. In this exemplary illustrative embodiment, the thickness t1 of the capping layer 120 can be formed to be about 10 Å, which is half of the thickness t2 of the first gate dielectric layer 131.

The second gate dielectric layer 133 can be formed using a thermal CVD (Chemical Vapor Deposition) oxide layer formation method. The oxide layer formed by thermal CVD can be, for example, MTO (Middle Temperature Oxide), HTO (High Temperature Oxide), or BPSG (BoroPhosphoSilicate Glass). For example, in one particular illustrative exemplary embodiment, the second gate dielectric layer 133 can be formed as a HTO (High Temperature Oxide) layer using $SiH_2Cl_2$, (Dichlorosilane, DCS) with superior pressure resistance and TDDB (Time Dependent Dielectric Breakdown) characteristics and oxygen ($O_2$) gas as source gas.

The second gate dielectric layer 133 can be formed at a temperature between about 600° C. and about 800° C. and under pressure between about 0.1 torr and about 10 torr.

When the step of forming the second gate dielectric layer 133 is performed at a temperature below about 600° C., the CVD process cannot be performed properly. As a result, since deposition of the second gate dielectric layer 133 cannot be performed properly under these conditions, the second gate dielectric layer 133 having relatively poor TDDB (Time Dependent Dielectric Breakdown) characteristics may be formed. As a result, the reliability of semiconductor device may be degraded.

When the step of forming the second gate dielectric layer 133 is performed at a temperature above about 800° C., deposition of the second gate dielectric layer 133 can proceed correctly, but the characteristics of the layer under the second gate dielectric layer 133 may be negatively affected. For example, in a case in which the epitaxial layer 110 under the second gate dielectric layer 133 includes Si—Ge, it can change the aggregation characteristics of Ge. Thus, Ge crystallization with Si does not occur, and a Ge agglomeration phenomenon, in which only Ge atoms agglomerate together, occurs. As a result, mobility characteristics and charge leakage characteristics of the epitaxial layer 110 including Si—Ge can be degraded. Therefore, when the second gate dielectric layer 133 formed on the epitaxial layer 110 including Si—Ge is formed at a temperature above about 800° C., electrical characteristics of the epitaxial layer 110 including Si—Ge under the second gate dielectric layer 133 may be degraded. Also, using the epitaxial layer 110 as a channel region of a thin film transistor can create a reliability problem of the semiconductor device.

As described above, according to the fabricating method of a semiconductor device based on the first exemplary embodiment of the present inventive concept, the first and second gate dielectric layers 131 and 133 are not formed directly on the epitaxial layer 110. Thus, after forming the capping layer 120 on the epitaxial layer 110, the capping layer 120 is oxidized at a temperature below about 800° C. to form the first gate dielectric layer 131, which does not change the characteristics of the capping layer 120. The second gate dielectric layer 133 is formed on the first gate dielectric layer 131. As a result, a dielectric layer having superior TDDB (Time Dependent Dielectric Breakdown) characteristics without changing the characteristics of the epitaxial layer 110 is formed. Thus, according to the inventive concept, at a relatively low temperature, a dielectric layer having superior TDDB (Time Dependent Dielectric Breakdown) characteristics is formed without degrading the characteristics of bottom layer (for example, Si—Ge epitaxial layer).

Figure 6:
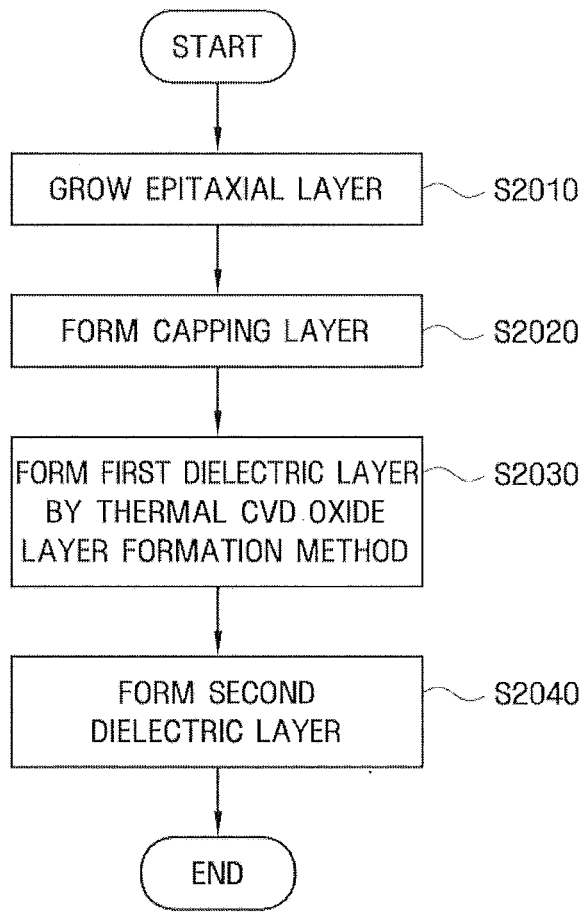
FIG. 6 is a flow chart illustrating steps in a method of fabricating a semiconductor device according to a second exemplary embodiment of the present inventive concept.

Next, referring to FIGS. 6 through 10, a method of fabricating a semiconductor device according to a second exemplary embodiment of the present inventive concept is described. FIG. 6 is a flow chart illustrating a method of fabricating a semiconductor device according to the second exemplary embodiment of the present inventive concept. FIGS. 7 through 10 are schematic sectional views sequentially illustrating the method of fabricating a semiconductor device according to the second exemplary embodiment of the present inventive concept.

Figure 7:
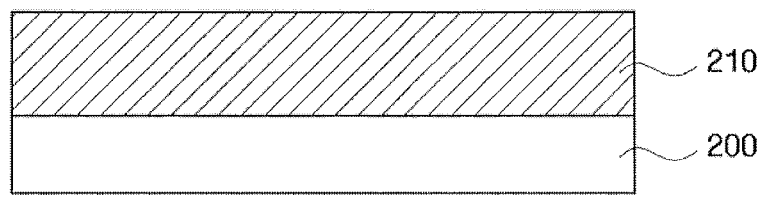
FIGS. 7 through 10 are schematic sectional views sequentially illustrating the fabricating method of a semiconductor device according to the second exemplary embodiment of the present inventive concept.

Referring to FIGS. 6 and 7, in the method of fabricating a semiconductor device according to the second exemplary embodiment of the present inventive concept an epitaxial layer 210 is formed or grown on a semiconductor substrate 200 (Step S2010).

In some exemplary embodiments, the semiconductor substrate 200 can include bulk-type silicon. One of solid phase epitaxy (SPE), liquid phase epitaxy (LPE), and vapor phase epitaxy (VPE) can be used to grow the epitaxial layer 210 on the semiconductor substrate 200. For example, in the method of fabricating a semiconductor device according to the second exemplary embodiment, by using a source gas including silicon (Si) and germanium (Ge), the single-crystal epitaxial layer 210 is formed at a temperature between about 500° C. and about 800° C. As a result, on the semiconductor substrate 200, the single-crystal epitaxial layer 210 including Si—Ge is formed. Next, to stabilize the Si—Ge single-crystal epitaxial layer 210, a heat treatment process can be additionally performed.

Figure 8:
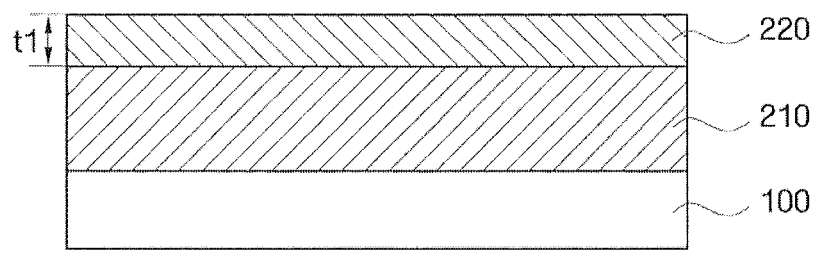

Next, referring to FIGS. 6 and 8, a capping layer 220 is formed on the epitaxial layer 210 (Step S2020). The capping layer 220 is formed as a second gate dielectric layer (refer to 233 of FIG. 10) by ISSG (In-Situ Steam Generation) process in a subsequent process step, as described below in greater detail.

The capping layer 220 can be formed with a source gas including silicon (Si) to grow an epitaxial layer including silicon (Si). For example, the capping layer 220 can be formed using a $SiH_2Cl_2$, (Dichlorosilane, DCS) source gas and a process gas including HCl. In some exemplary embodiments, the capping layer 220, as described above, can be formed on the epitaxial layer 210 after forming the epitaxial layer 210. Alternatively, in some exemplary embodiments, the epitaxial layer 210 and the capping layer 220 can be formed simultaneously. Thus, by controlling the concentration of germanium (Ge), which is a source gas used during the epitaxial layer 210 formation, the epitaxial layer 210 and the capping layer 220 can be formed simultaneously. In this case, the epitaxial layer 210 including Si—Ge and the capping layer 220 which is an epitaxial layer including Si can be formed on the semiconductor substrate 200 simultaneously.

The capping layer 220 can be formed to have a thickness of a first thickness t1. In some exemplary embodiments, the first thickness t1 of capping layer 220 is related to a second thickness t2 of a second gate dielectric layer (refer to 231 of FIG. 10) to be formed in a subsequent process step. In some particular illustrative exemplary embodiments, the first thickness t1 of the capping layer 220 can be formed to be about half of the second thickness t2 of the second gate dielectric layer (refer to 233 of FIG. 10) to be formed in a subsequent process step, as described below in greater detail.

Figure 9:
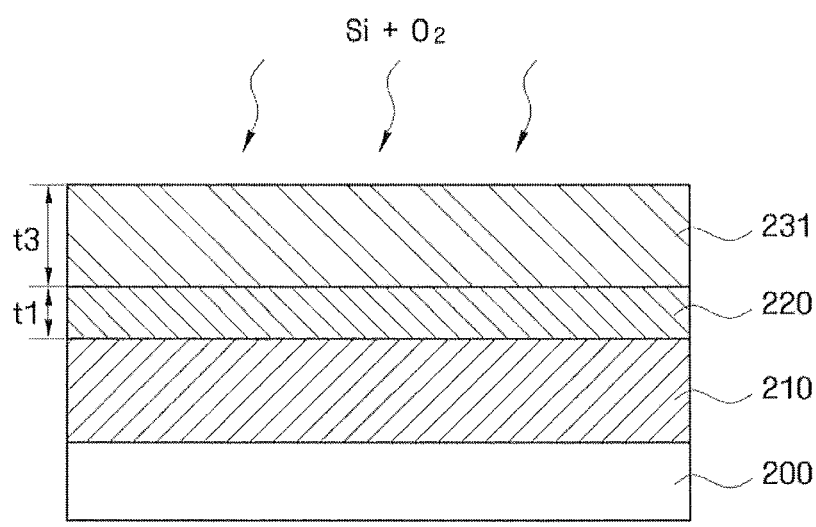

Next, referring to FIGS. 6 and 9, a first gate dielectric layer 231 is formed on the capping layer 220 (Step S2030). In some embodiments, the first gate dielectric layer 231 can be formed using a thermal CVD (Chemical Vapor Deposition) oxide layer formation method. In some embodiments, the thermal CVD (Chemical Vapor Deposition) oxide layer can be, for example, MTO (Middle Temperature Oxide), HTO (High Temperature Oxide), or BPSG (BoroPhosphoSilicate Glass). For example, in some embodiments, the first gate dielectric layer 231 can be formed as a HTO (High Temperature Oxide) layer using $SiH_2Cl_2$ (Dichlorosilane, DCS) with superior pressure resistance and TDDB (Time Dependent Dielectric Breakdown) characteristics and $O_2$ gas as a source gas.

The first gate dielectric layer 231 can be formed at a temperature between about 600° C. and about 800° C. and under pressure between about 0.1 torr and about 10 torr.

When formation of the first gate dielectric layer 231 is performed at a temperature below about 600° C., the CVD process cannot be performed properly. Thus, since deposition of the first gate dielectric layer 231 cannot be performed properly, the first gate dielectric layer 231 may be formed to have relatively poor TDDB (Time Dependent Dielectric Breakdown) characteristics. As a result, the reliability of the semiconductor device may be degraded.

When the step of forming the first gate dielectric layer 231 is performed at a temperature above about 800° C., deposition of the first gate dielectric layer 231 can proceed correctly, but it can negatively affect the characteristics of the layer under the first gate dielectric layer 231. For example, in a case in which the epitaxial layer 210 under the first gate dielectric layer 231 includes Si—Ge, it can change aggregation characteristics of Ge. Thus, Ge crystallization with Si does not occur, and a Ge agglomeration phenomenon where only Ge atoms agglomerate together occurs. As a result, the mobility characteristics and charge leakage characteristics of the epitaxial layer 210 including Si—Ge can be degraded. Therefore, when the first gate dielectric layer 231 formed on the epitaxial layer 210 including Si—Ge is formed at a temperature above about 800° C., the electrical characteristics of the epitaxial layer 210 including Si—Ge under the first gate dielectric layer 231 may be degraded. Also, using the epitaxial layer 210 as a channel region of a thin film transistor can create a reliability problem of a semiconductor device.

Figure 10:
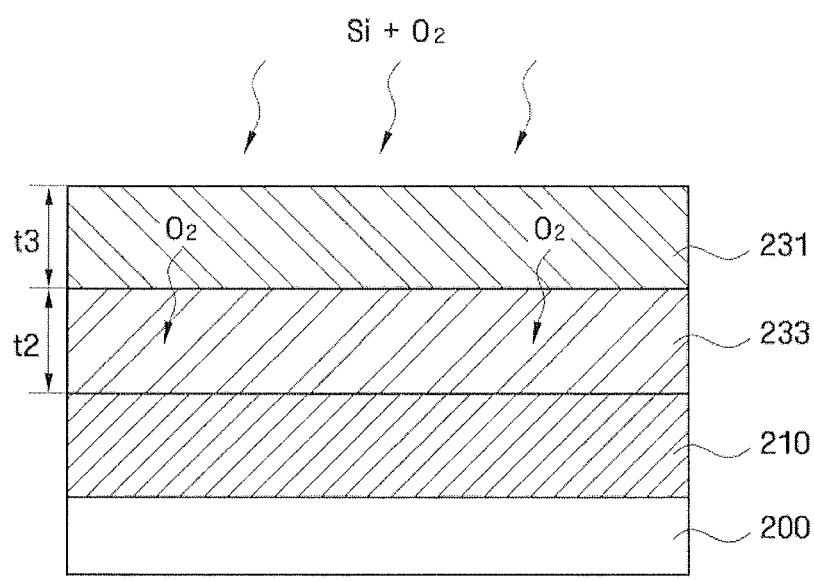

Next, referring to FIGS. 6 and 10, the capping layer 220 is oxidized in an oxygen atmosphere, and a second gate dielectric layer 233 is formed (Step S2040).

In the second exemplary embodiment, the capping layer 220 can be oxidized during formation of the first gate dielectric layer 231. Thus, during formation of the first gate dielectric layer 231, $O_2$ gas used as a source gas is diffused into the capping layer 220, and the second gate dielectric layer 233 is formed. In contrast, as illustrated and described in connection with the first exemplary embodiment, ISSG (In-Situ Steam Generation) equipment can be used to oxidize capping 220 to form the second gate dielectric layer 233.

The second gate dielectric layer 233 can be formed at a temperature between about 600° C. and about 800° C. in an oxygen atmosphere. Significance of the thresholds of the temperature range was described above in detail in connection with formation of the first gate dielectric layer 131 of the first exemplary embodiment. Accordingly, detailed description thereof will not be repeated here.

In some exemplary embodiments, the second gate dielectric layer 233 can be formed to have about twice the thickness of the capping layer 220. To aid in understanding, the thickness of the second gate dielectric layer 231 is defined as a second thickness t2. As described in detail above, the capping layer 220, for example, includes Si, but the second gate dielectric layer 233 includes silicon oxide ($SiO_2$). Thus, since the capping layer 220 practically only includes Si monoatoms, but the second gate dielectric layer 233 includes a silicon (Si) atom as well as two oxygen (O) atoms, the volume of the second gate dielectric layer 233 can be increased relatively compared to the capping layer 220. Therefore, the second gate dielectric layer 233 can be formed to have a thickness t2 about twice the first thickness t1 of the capping layer 220. Also, the first thickness t1 of the capping layer 220 can be determined by considering a final target of the second thickness t2 of the second gate dielectric layer 233. For example, if the second thickness t2 of the second gate dielectric layer 233 is formed to have a thickness between about 10 Å and about 50 Å, the first thickness t1 of the capping layer 220 can be formed to have a thickness between about 5 Å and about 25 Å.

The capping layer 220 can be oxidized under pressure between about 0.1 torr and about 10 torr. If oxygen gas used for the capping layer 220 oxidization is diluted with nitrogen gas or an inert gas, drastic oxidation of the capping layer 220 can be prevented.

In some particular exemplary embodiments, the thickness t3 of the first gate dielectric layer 231 and the thickness t2 of the second gate dielectric layer 233 can be formed to have a sum of about 50 Å. For example, when the thickness t3 of the first gate dielectric layer 231 is formed to be about 20 Å, the thickness t2 of the second gate dielectric layer 233 can be formed to be about 30 Å. In this case, the thickness t1 of the capping layer 220 can be formed to be about 15 Å, which is half of the thickness t2 of the second gate dielectric layer 233.

As described in detail above, according to the method of fabricating a semiconductor device based on the second exemplary embodiment of the present inventive concept, the first and second gate dielectric layers 231 and 233 having superior TDDB (Time Dependent Dielectric Breakdown) characteristics without changing the characteristics of the epitaxial layer 210 are formed. Thus, at a relatively low temperature, a dielectric layer having superior TDDB (Time Dependent Dielectric Breakdown) characteristics is formed without degrading the characteristics of the under layer (for example, the Si—Ge epitaxial layer).

Figure 11:
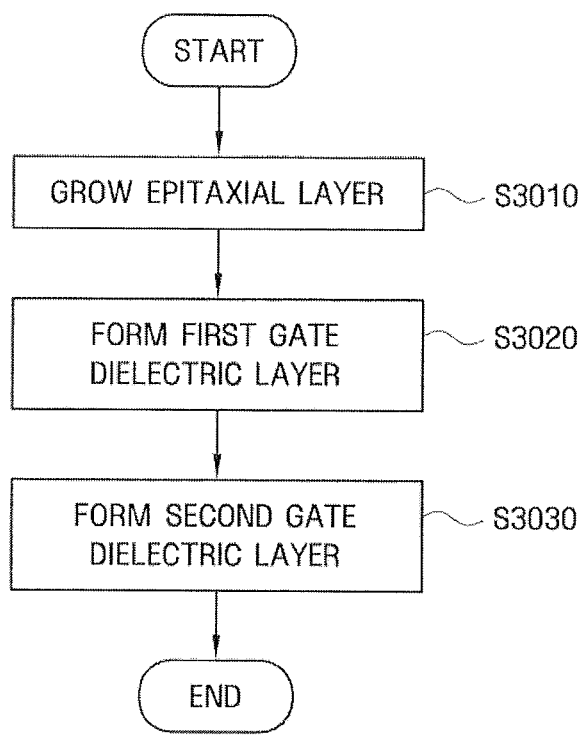
FIG. 11 is a flow chart illustrating steps in a method of fabricating a semiconductor device according to a third exemplary embodiment of the present inventive concept.
Figure 12:
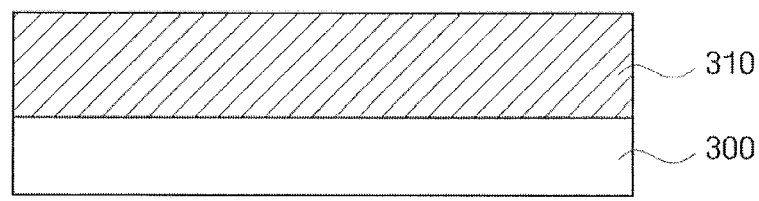
FIGS. 12 through 14 are schematic sectional views sequentially illustrating the fabricating method of a semiconductor device according to the third exemplary embodiment of the present inventive concept.
Figure 13:
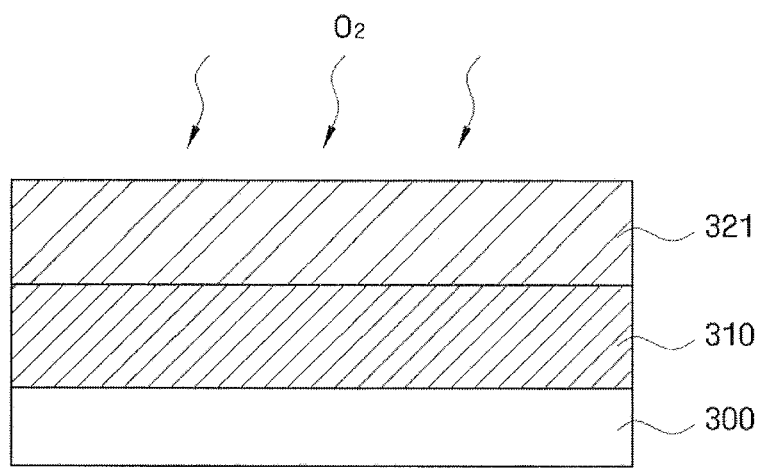
Figure 14:
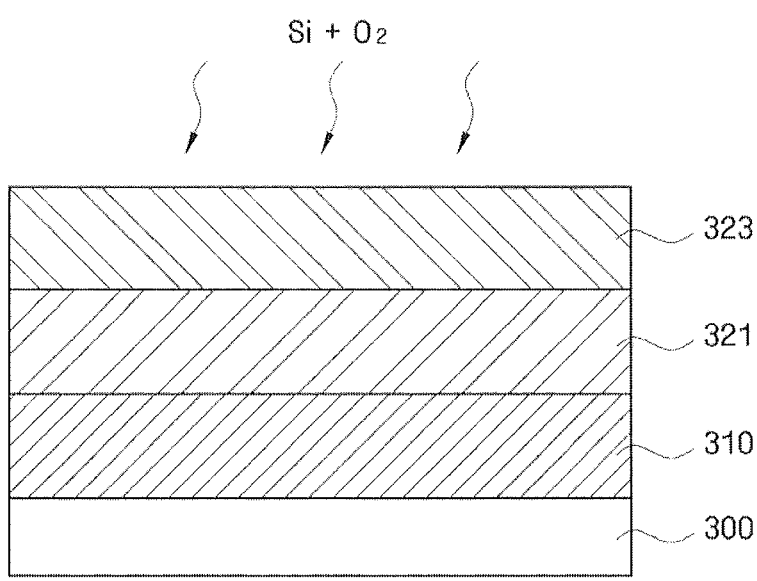

Next, referring to FIGS. 11 through 14, a method of fabricating a semiconductor device according to a third exemplary embodiment of the present inventive concept is described. FIG. 11 is a flow chart illustrating a method of fabricating a semiconductor device according to the third exemplary embodiment of the present inventive concept. FIGS. 12 through 14 are schematic sectional views sequentially illustrating the fabricating method of a semiconductor device according to the third exemplary embodiment of the present inventive concept.

Referring to FIGS. 11 and 12, in the method of fabricating a semiconductor device according to the third exemplary embodiment of the present inventive concept, an epitaxial layer 310 is formed or grown on a semiconductor substrate 300 (Step S3010). In some exemplary embodiments, the epitaxial layer 310 can be grown as a layer including Si using a source gas including Si. For example, the epitaxial layer 310 can be formed using a source gas of $SiH_2Cl_2$ (Dichlorosilane, DCS) and a process gas including HCl.

Then, referring to FIGS. 1 and 13, part of the epitaxial layer 310 is oxidized in an oxygen atmosphere, and a first gate dielectric layer 321 is formed (Step S3020). In this step, an area from the surface of the epitaxial layer 310 to a predetermined region inside the epitaxial layer 310 can be oxidized.

Part of the epitaxial layer 310 can be oxidized using ISSG (In-Situ Steam Generation) equipment. The step of oxidizing part of the epitaxial layer 310 to form a first gate dielectric layer 321 can be performed under an oxygen atmosphere at a temperature between about 600° C. and about 800° C. When the epitaxial layer 310 is processed to form the first gate dielectric layer 321 at a temperature below about 600° C., oxidization may not occur or can be delayed, and this can cause process loss. For example, the first gate dielectric layer 321 having relatively poor TDDB (Time Dependent Dielectric Breakdown) characteristics can be formed, and the reliability of semiconductor device can be degraded.

When the step of oxidizing the epitaxial layer 310 to form the first gate dielectric layer 321 is performed at a temperature above about 800° C., oxidization of part of the epitaxial layer 310 can proceed correctly, but the characteristics of the epitaxial layer 310 region where no oxidization occurs can be affected. For example, the mobility characteristics and charge leakage characteristics of the epitaxial layer 310 can be degraded. Therefore, using the epitaxial layer 310 as a channel region of a thin film transistor can create a reliability problem of a semiconductor device.

Next, referring to FIGS. 11 and 14, a second gate dielectric layer 323 can be formed on the first gate dielectric layer 321 (Step S3030). The second gate dielectric layer 323 can be formed using a thermal CVD (Chemical Vapor Deposition) oxide layer formation method. The thermal CVD (Chemical Vapor Deposition) oxide layer can be, for example, MTO (Middle Temperature Oxide), HTO (High Temperature Oxide), or BPSG (BoroPhosphoSilicate Glass). For example, the second gate dielectric layer 323 can be formed as a HTO (High Temperature Oxide) layer by using $SiH_2Cl_2$ (Dichlorosilane, DCS) with superior pressure resistance and TDDB (Time Dependent Dielectric Breakdown) characteristics and $O_2$ gas as a source gas.

The second gate dielectric layer 323 can be formed at a temperature between about 600° C. and about 800° C. and under pressure between about 1 torr and about 10 torr.

When the step of forming the second gate dielectric layer 323 is performed at a temperature below about 600° C., the CVD process to form the second gate dielectric layer 323 cannot be performed properly. Thus, since deposition of the second gate dielectric layer 323 cannot be performed properly, the second gate dielectric layer 323 having relatively poor TDDB (Time Dependent Dielectric Breakdown) characteristics can be formed. As a result, the reliability of semiconductor device can be degraded.

When the step of forming the second gate dielectric layer 323 is performed at a temperature above about 800° C., deposition of the second gate dielectric layer 323 can proceed correctly, but the characteristics of the layer under the second gate dielectric layer 323 can be affected. For example, the mobility characteristics and charge leakage characteristics of the epitaxial layer 310 under the second gate dielectric layer 323 can be degraded. Therefore, using the epitaxial layer 310 as a channel region of a thin film transistor can create a reliability problem of a semiconductor device.

As described above in detail, according to the method of fabricating a semiconductor device based on the third exemplary embodiment of the present inventive concept, the first and second gate dielectric layers 321 and 323 having superior TDDB (Time Dependent Dielectric Breakdown) characteristics without changing the characteristics of the epitaxial layer 310 can be formed. Thus, a dielectric layer having superior TDDB (Time Dependent Dielectric Breakdown) characteristics can be formed at a relatively low temperature without degrading the characteristics of a under layer (for example, the Si—Ge epitaxial layer).

Figure 15:
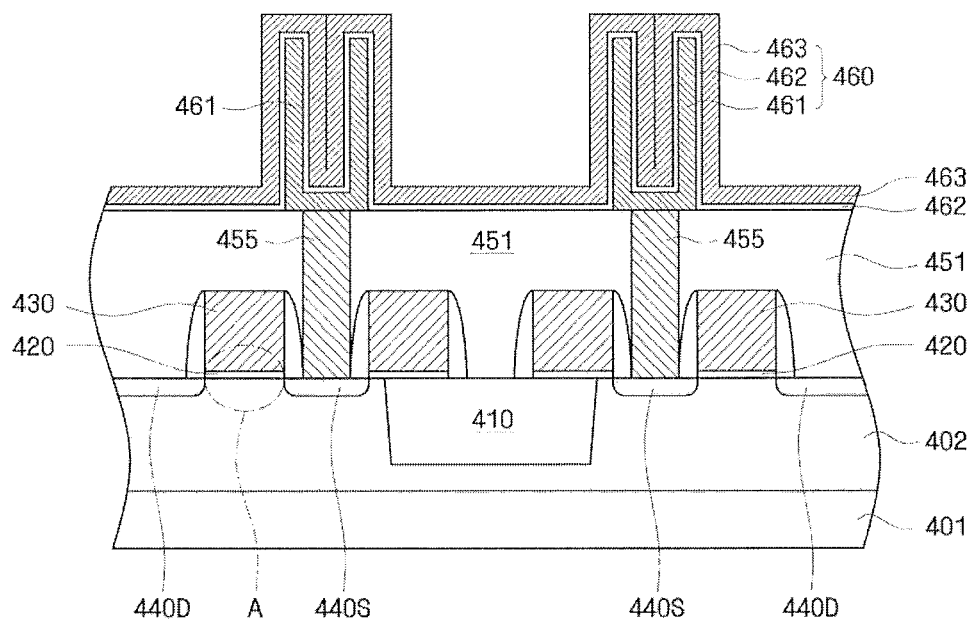
FIG. 15 is a schematic sectional view illustrating a DRAM including a gate dielectric layer fabricated according to the exemplary embodiments of the present inventive concept.
Figure 16:
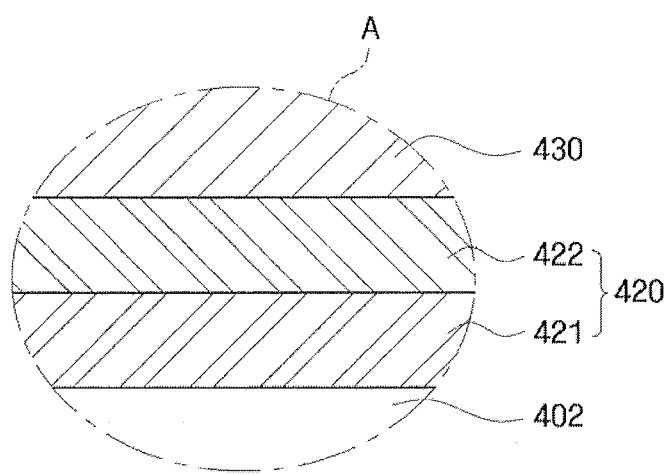
FIG. 16 is a schematic sectional view illustrating an enlargement of a region 'A' of FIG. 15.

Referring to FIGS. 15 and 16, a semiconductor device including a gate dielectric layer fabricated by the methods of the exemplary embodiments of the present inventive concept described above is described in detail. FIG. 15 is a schematic sectional view illustrating a DRAM including a gate dielectric layer fabricated according to the exemplary embodiments of the present inventive concept. FIG. 16 is a schematic sectional view of an enlargement of a region 'A' of FIG. 15. Although FIG. 15 illustrates a DRAM including a gate dielectric layer fabricated according to the exemplary embodiments of the present inventive concept, the gate dielectric layer fabricated according to the exemplary embodiments of the present inventive concept can be applied to semiconductor devices other than DRAM devices, such other devices including RRAM, PRAM, SRAM, and FRAM. Also, the gate dielectric layer can be applied to semiconductor devices other than the semiconductor devices listed above.

Referring to FIG. 15, a semiconductor device illustrated in FIG. 15 includes a semiconductor substrate 401 and an epitaxial layer 402 formed on the semiconductor substrate 401.

Also, the semiconductor device includes a device isolation pattern 410 in the epitaxial layer 402. The device isolation pattern 410 has, for example, a STI (Shallow Trench Isolation) structure in the epitaxial layer 402. A gate dielectric layer 420 and a word line 430 are formed on the epitaxial layer 402. Source/drain regions 440S and 440D are formed in part of the epitaxial layer 402 to make a transistor structure. An interlayer dielectric layer 451 that covers the transistor is formed on the transistor. A capacitor 460 including a lower electrode 461, a dielectric layer 462, and an upper electrode 463 is formed on the interlayer dielectric layer 451. A contact plug 455 that connects the lower electrode 461 to the source region 440S is formed in the interlayer dielectric layer 451.

Referring to FIGS. 15 and 16, in some exemplary embodiments, the semiconductor device can include a gate dielectric layer 420, which can be a double layer. The gate dielectric layer 420 can include a first gate dielectric layer 421 and a second gate dielectric layer 422 formed over the first gate dielectric layer 421. The gate dielectric layer 420 is fabricated according to the exemplary embodiments of the present inventive concept described herein in detail.

Therefore, the first and second dielectric layers 421 and 422 of the gate dielectric layer 420 included in the semiconductor device illustrated in FIG. 15 is not formed directly on the epitaxial layer 402. Thus, after forming a capping layer (not shown) on the epitaxial layer 402, at a temperature that does not change the characteristics of the epitaxial layer 402, the capping layer is oxidized to form the first dielectric layer 421, and the second dielectric layer 422 is formed on the first dielectric layer 421. As a result, the semiconductor device including the gate dielectric layer having superior TDDB (Time Dependent Dielectric Breakdown) characteristics without changing the characteristics of the epitaxial layer 402 can be formed.

Figure 17:
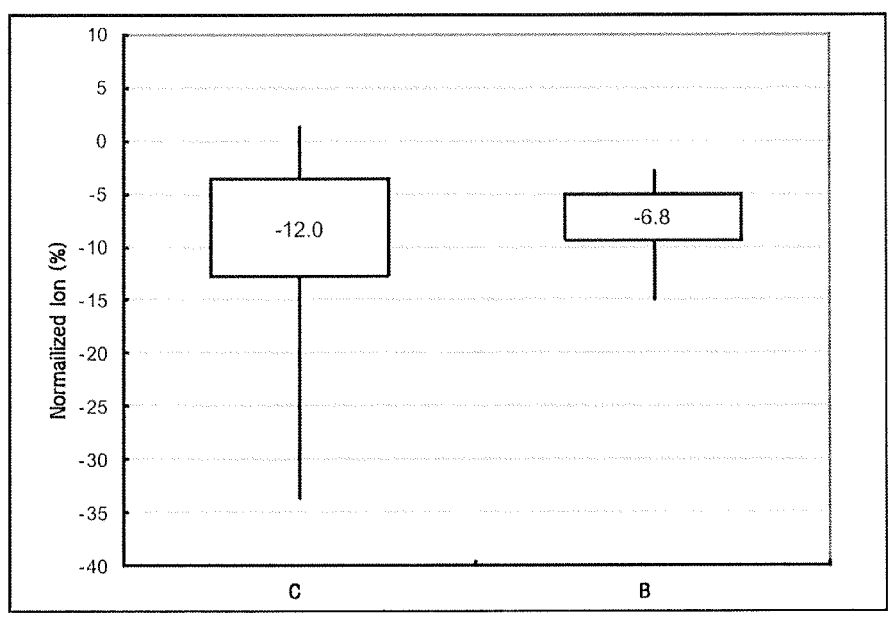
FIG. 17 is a graph illustrating operational characteristics of a semiconductor device fabricated according to one or more embodiments of the present inventive concept.

Referring to FIG. 17 characteristics of a semiconductor device fabricated according to the present inventive concept are described. FIG. 17 is a graph illustrating operational characteristics of a semiconductor device fabricated according to the present inventive concept.

First, referring to FIG. 17, a Y-axis of FIG. 17 represents normalization of on-current characteristics of a semiconductor device. B of FIG. 17 represents a semiconductor device fabricated according to the exemplary embodiments of the present inventive concept, and C represents a semiconductor device fabricated according to the conventional technology.

For example, B is a semiconductor device including a gate dielectric layer formed, after forming a capping layer with a thickness of about 15 Å, by oxidizing the capping layer using ISSG (In-Situ Steam Generation) equipment. C is a semiconductor device including a gate dielectric layer formed, without forming a capping layer, directly on the semiconductor substrate with a thickness of about 30 Å.

Referring to FIG. 17, it was observed that the on-current operating characteristics of B fabricated according to the exemplary embodiment of the present inventive concept included relatively small variance compared to a standard value and superior characteristics compared to the on-current characteristics of the C process. Also, it was observed that on-current operating characteristics of C included relatively large variance compared to the standard value and inferior characteristics compared to the on-current characteristics of the B process. For example, the semiconductor device fabricated according to the exemplary embodiment of the present inventive concept showed an average of about 6.8% characteristics degradation compared to the standard value; however, the semiconductor device fabricated according to the conventional technology showed an average of about 12.0% characteristics degradation compared to the standard value. Thus, the semiconductor device fabricated according to the exemplary embodiment of the present inventive concept showed 5.2% performance improvement over the semiconductor fabricated according to the conventional technology.

Therefore, the semiconductor device fabricated according to the exemplary embodiment of the present inventive concept has relatively superior operating characteristics and reliability over the semiconductor fabricated according to the conventional technology.

According to the inventive concept, by growing or forming an in-situ steam generation (ISSG) film at a relatively low temperature less than 800° C., the interface characteristics and oxide quality are greatly improved. At high temperatures, due to Ge agglomeration of SiGe, oxide quality is reduced. By using the low-temperature ISSG thin film, the interface and oxide quality are improved compared to the case of using HTO. As a result, time-dependent dielectric breakdown (TDDB) is improved. In the device and manufacturing method of the inventive concept, a single ISSG thin film or a mixed structure including ISSG and HTO films are used. According to the inventive concept, a relatively low-temperature process and Si epitaxial deposition are performed to reduce the effects on the SiGe channel in PMOS devices.

While the present inventive concept has been particularly shown and described with reference to exemplary embodiments thereof, it will be understood by those of ordinary skill in the art that various changes in form and detail may be made therein without departing from the spirit and scope of the present inventive concept as defined by the following claims. The exemplary embodiments should be considered in a descriptive sense only and not for purposes of limitation.

What is claimed is:

1. A method of fabricating a semiconductor device, the method comprising:
providing a semiconductor substrate;
forming an epitaxial layer on the semiconductor substrate;
forming a capping layer on the epitaxial layer, the capping layer having a first thickness;
oxidizing the capping layer in an atmosphere containing oxygen to form a first gate dielectric layer, the first gate dielectric layer having a second thickness; and forming a second gate dielectric layer on the first gate dielectric layer wherein the epitaxial layer includes silicon (Si) and germanium (Ge), wherein the first thickness is about half of the second thickness, and wherein forming the second gate dielectric layer comprises performing a thermal chemical vapor deposition (CVD) oxide layer formation method.

2. The method of claim 1, wherein forming the first gate dielectric layer is performed at a temperature between about 600° C. and about 800° C.

3. The method of claim 2, wherein the capping layer is an epitaxial layer including silicon.

4. The method of claim 1, wherein forming the second gate dielectric layer is performed at a temperature between about 600° C. and about 800° C.

* * * * *